(12) United States Patent
Lee et al.

(10) Patent No.: US 12,272,402 B2
(45) Date of Patent: Apr. 8, 2025

(54) VERTICAL NONVOLATILE MEMORY DEVICE INCLUDING MEMORY CELL STRING

(71) Applicant: Samsung Electronics Co., Ltd., Suwon-si (KR)

(72) Inventors: Minhyun Lee, Suwon-si (KR); Taein Kim, Seoul (KR); Youngtek Oh, Suwon-si (KR); Hyeonjin Shin, Suwon-si (KR); Changseok Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 422 days.

(21) Appl. No.: 17/708,362

(22) Filed: Mar. 30, 2022

(65) Prior Publication Data
US 2022/0319602 A1 Oct. 6, 2022

(30) Foreign Application Priority Data
Apr. 2, 2021 (KR) .................. 10-2021-0043524

(51) Int. Cl.
*G11C 16/04* (2006.01)
*H10B 41/20* (2023.01)
(Continued)

(52) U.S. Cl.
CPC ......... *G11C 16/0483* (2013.01); *H10B 41/20* (2023.02); *H10B 41/35* (2023.02); *H10B 43/20* (2023.02); *H10B 43/35* (2023.02)

(58) Field of Classification Search
CPC ........... G11C 16/0483; G11C 2213/75; H10B 41/20; H10B 41/35; H10B 43/20;
(Continued)

(56) References Cited

U.S. PATENT DOCUMENTS

| 8,125,247 B2 | 2/2012 | Koo et al. |
| 8,421,060 B2 | 4/2013 | Koo et al. |

(Continued)

FOREIGN PATENT DOCUMENTS

| CN | 107994030 B | 2/2019 |
| KR | 101016437 B1 | 2/2011 |

(Continued)

OTHER PUBLICATIONS

Dick James and Jeongdong Choe, 'TechInsights memory technology update from IEDM18' Apr. 11, 2019, https://www.techinsights.com/blog/techinsights-memory-technology-update-iedm18> .

(Continued)

*Primary Examiner* — Ida M Soward
(74) *Attorney, Agent, or Firm* — HARNESS, DICKEY & PIERCE, P.L.C.

(57) ABSTRACT

Provided is a vertical nonvolatile memory device in which a thickness of one memory cell is reduced to reduce an entire thickness of a memory cell string and increase the number of stacked memory cells. The nonvolatile memory device includes a plurality of memory cell strings. Each of the memory cell strings may include a plurality of insulating spacers each extending in a first direction, a plurality of gate electrodes each extending in the first direction and alternately arranged with the plurality of insulating spacers in a second direction perpendicular to the first direction, and a plurality of contacts respectively arranged to contact a side surface of the plurality of gate electrodes respectively corresponding to the plurality of contacts.

24 Claims, 12 Drawing Sheets

(51) Int. Cl.
    *H10B 41/35*     (2023.01)
    *H10B 43/20*     (2023.01)
    *H10B 43/35*     (2023.01)

(58) Field of Classification Search
    CPC ........ H10B 43/35; H10B 43/27; H10B 43/30; H01L 29/7926
    See application file for complete search history.

(56) References Cited

U.S. PATENT DOCUMENTS

| | | | |
|---|---|---|---|
| 8,587,044 | B2 | 11/2013 | Koo et al. |
| 9,899,231 | B2 | 2/2018 | Kim et al. |
| 10,199,391 | B2 | 2/2019 | Ishikura et al. |
| 10,283,708 | B2 | 5/2019 | Wu et al. |
| 10,847,577 | B2 | 11/2020 | Choi et al. |
| 2010/0254191 | A1* | 10/2010 | Son .......... H10B 43/50 257/E21.294 |
| 2011/0292731 | A1* | 12/2011 | Kim .......... G11C 16/0466 257/314 |
| 2012/0164821 | A1* | 6/2012 | Kim .......... H01L 21/0273 438/588 |
| 2015/0372000 | A1* | 12/2015 | Jee .......... H01L 29/792 257/314 |
| 2016/0071877 | A1* | 3/2016 | Kim .......... H10B 43/27 257/314 |
| 2016/0268264 | A1* | 9/2016 | Hwang .......... H10B 43/20 |
| 2018/0026047 | A1* | 1/2018 | Park .......... H10B 43/35 257/314 |
| 2019/0172838 | A1* | 6/2019 | Jo .......... H10B 43/50 |
| 2019/0221558 | A1* | 7/2019 | Chen .......... H10B 43/35 |
| 2019/0312049 | A1* | 10/2019 | Cheon .......... H10B 43/27 |

FOREIGN PATENT DOCUMENTS

| | | |
|---|---|---|
| KR | 101084019 B1 | 11/2011 |
| KR | 2013/0053097 A | 5/2013 |
| KR | 2013/0063236 A | 6/2013 |
| KR | 2016/0088763 A | 7/2016 |
| KR | 2018/0072259 A | 6/2018 |
| KR | 2019/0083582 A | 7/2019 |

OTHER PUBLICATIONS

Ning C. Wang et al., 'Replacing Copper Interconnects with Graphene at a 7-nm Node' IEDM 2017.

Chang-Seok Lee et al., 'Fabrication of Metal/Graphene Hybrid Interconnects by Direct Graphene Growth and Their Integration Properties' *Advanced Electronic Materials*, vol. 4, 2018, 1700624.

'International Roadmap for Devices and Systems' IEEE, 2020.

\* cited by examiner

VERTICAL NONVOLATILE MEMORY DEVICE INCLUDING MEMORY CELL STRING

CROSS-REFERENCE TO RELATED APPLICATION

This application is based on and claims priority under 35 U.S.C. § 119 to Korean Patent Application No. 10-2021-0043524, filed on Apr. 2, 2021, in the Korean Intellectual Property Office, the disclosure of which is incorporated by reference herein in its entirety.

BACKGROUND

1. Field

The disclosure relates to a vertical nonvolatile memory device including memory cell strings.

2. Description of the Related Art

A nonvolatile memory device, which is a semiconductor memory device, includes a plurality of memory cells which retain data even in a state in which power is blocked and use the stored data again when power is supplied. As an example of use of the nonvolatile memory device, the nonvolatile memory device may be used in a cellular phone, a digital camera, a portable digital assistant (PDA), a mobile computer device, a stationary computer device, and other devices.

Recently, research into using a three-dimensional (or a vertical) NAND (or VNAND) structure in a chip for forming a next-generation neuromorphic computing platform or a neural network has been conducted. In particular, technologies for obtaining high density and low power consumption and capable of allowing a random access to a memory cell may be required.

SUMMARY

Provided is a vertical nonvolatile memory device in which a thickness of one memory cell is reduced to reduce an entire thickness of a memory cell string and increase the number of stacked memory cells.

Additional aspects will be set forth in part in the description which follows and, in part, will be apparent from the description, or may be learned by practice of the presented embodiments of the disclosure.

According to an embodiment, a nonvolatile memory device includes a plurality of memory cell strings. Each of the memory cell strings may include a plurality of insulating spacers each extending in a first direction, a plurality of gate electrodes each extending in the first direction and alternately arranged with the plurality of insulating spacers in a second direction perpendicular to the first direction, and a plurality of contacts respectively arranged to contact a side surface of the plurality of gate electrodes respectively corresponding to the plurality of contacts.

In some embodiments, a thickness of each of the plurality of gate electrodes may be in a range of about 0.3 nm to about 15 nm.

In some embodiments, a width in the first direction of the plurality of insulating spacers and the plurality of gate electrodes, which are alternately arranged with each other, may gradually decrease in the second direction, and the plurality of insulating spacers and the plurality of gate electrodes each may have an inclined peripheral side surface.

In some embodiments, the inclined peripheral side surface of the plurality of insulating spacers and the plurality of gate electrodes alternately arranged with each other may have a continually extending sloped surface.

In some embodiments, for each corresponding gate electrode among the plurality of gate electrodes, the width in the first direction of an upper surface of the corresponding gate electrode may be identical to the width in the first direction of a lower surface of an overlying one of the plurality of insulating spacers arranged above the corresponding gate electrode, and the width in the first direction of a lower surface of the corresponding gate electrode may be identical to the width in the first direction of an upper surface of an underlying one of the plurality of insulating spacers arranged below the corresponding gate electrode.

In some embodiments, the plurality of contacts may be respectively arranged to contact the inclined peripheral side surface of the plurality of gate electrodes respectively corresponding to the plurality of contacts and not to contact an upper surface of the gate electrodes respectively corresponding to the plurality of contacts.

In some embodiments, a gradient of the inclined peripheral side surface of each of the plurality of insulating spacers may be greater than a gradient of the inclined peripheral side surface of each of the plurality of gate electrodes, and an edge portion of upper surfaces of the plurality of gate electrodes may be exposed to provide an exposed edge portion.

In some embodiments, the plurality of insulating spacers may have smaller widths in the first direction than widths of upper surfaces of the plurality of electrodes arranged directly below, respectively.

In some embodiments, the plurality of contacts may be respectively arranged to cover both the exposed edge portion of the upper surface and the inclined peripheral side surface of the plurality of gate electrodes respectively corresponding to the plurality of contacts.

In some embodiments, the plurality of contacts may extend in the second direction.

In some embodiments, each of the plurality of memory cell strings may further include a passivation layer arranged to fill a region around the plurality of contacts.

In some embodiments, each of the plurality of gate electrodes may include a conductive two-dimensional material layer.

In some embodiments, the conductive two-dimensional material layer may include at least one of a graphene, AuSe, $MoTe_2$, $NbSe_2$, $NbS_2$, $NbTe_2$, $PdTe_2$, $PtTe_2$, $TaS_2$, $TaSe_2$, and $VSe_2$.

In some embodiments, a grain size of the conductive two-dimensional material layer may be in a range of about 1 nm to about 10 cm.

In some embodiments, each of the plurality of gate electrodes may further include a metal material doped in the conductive two-dimensional material layer.

In some embodiments, a doping concentration of the metal material in the conductive two-dimensional material layer may be in a range of about $10^{18}/cm^3$ to about $10^{22}/cm^3$.

In some embodiments, the metal material may include at least one of Ag, Au, Pt, Ru, Mo, W, Al, Cu, Co, and Cr.

In some embodiments, each of the plurality of gate electrodes may include a metal material layer and a conductive two-dimensional material layer. The conductive two-dimensional material layer may be on a lower surface of the metal material layer or an upper surface of the metal material layer.

In some embodiments, each of the plurality of gate electrodes may include a metal material layer, a first conductive two-dimensional material layer, and a second conductive two-dimensional material layer. The first conductive two-dimensional material layer may be on at least one of a lower surface of the metal material layer and an upper surface of the metal material layer. The second conductive two-dimensional material layer may be on a side surface of the metal material layer.

In some embodiments, a layer direction of the first conductive two-dimensional material layer and a layer direction of the second conductive two-dimensional material layer may be perpendicular to each other.

According to an embodiment, a nonvolatile memory device includes a plurality of memory cell strings. Each of the plurality of memory cell strings may include a plurality of insulating spacers, a plurality of gate electrodes, and a plurality of contacts. The plurality of insulating spacers and the plurality of gate electrodes may extend in a first direction and may be alternately stacked in a second direction crossing the first direction. The plurality of gate electrodes may include inclined peripheral side surfaces that are inclined in a direction diagonal between the first direction and the second direction. The plurality of contacts may include inclined lower surfaces that are inclined in the direction diagonal between the first direction and the second direction. The plurality of contacts may be electrically connected to the plurality of gate electrodes, respectively, through connections between the inclined lower surfaces of the plurality of contacts and the inclined peripheral side surfaces of the plurality of gate electrodes.

In some embodiments, the nonvolatile memory device may further include a passivation layer including portions extending between the plurality of contacts in the second direction to separate the plurality of contacts from each other. A lower surface of the passivation layer may contact side surfaces of the plurality of insulating layers.

In some embodiments, the plurality of insulating spacers may include peripheral side surfaces that are recessed in the second direction from the inclined peripheral side surfaces of the plurality of gate electrodes adjacent thereto. The plurality of contacts may include horizontal lower surfaces that extend in the second direction from the inclined lower surfaces of the plurality of contacts. The horizontal lower surfaces of corresponding contacts among the plurality of contacts may extend in the second direction toward corresponding insulating spacers among the plurality of insulating spacers and contact parts of upper surfaces of corresponding gate electrodes among the plurality of gate electrodes.

In some embodiments, each of the plurality of gate electrodes may include a conductive two-dimensional material layer.

In some embodiments, each of the plurality of gate electrodes may be doped with a metal material.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
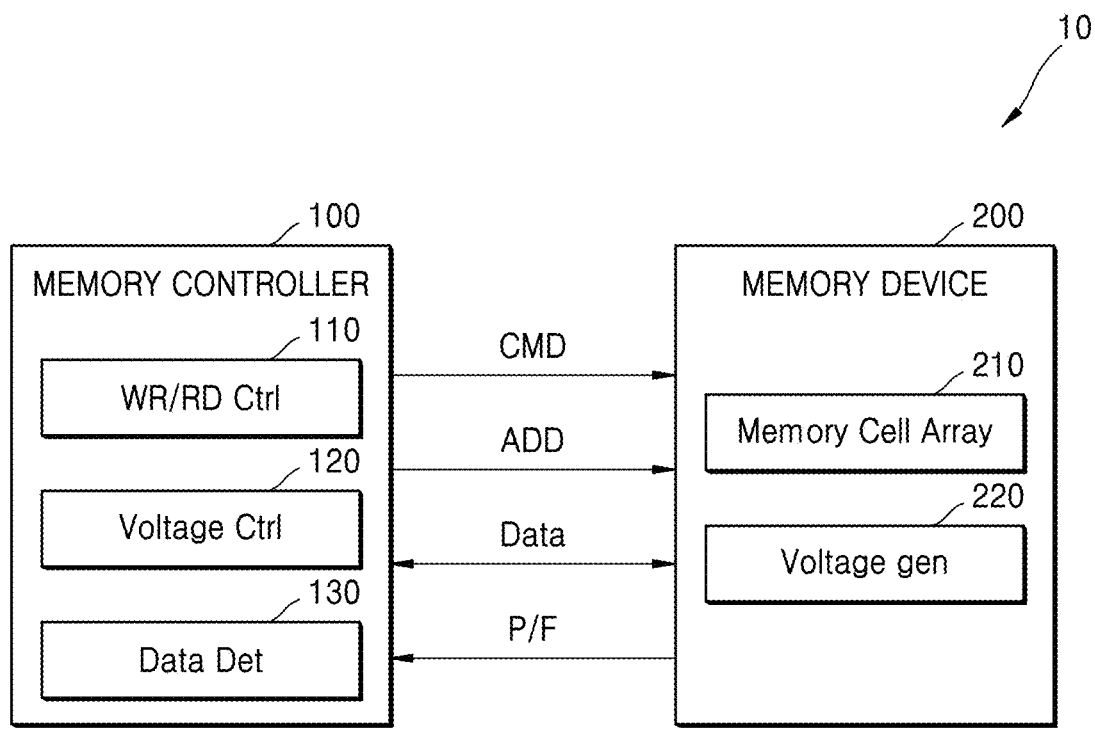
FIG. 1 is a block diagram of a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, a vertical nonvolatile memory device including a memory cell string will be described in detail with reference to the accompanying drawings. In the drawings, the same reference numerals denote the same elements and sizes of elements may be exaggerated for clarity and convenience of explanation. Also, the embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Operations included in a method may be performed in an appropriate order, unless the operations included in the method are described to be performed in an apparent order, or unless the operations included in the method are described to be performed otherwise.

Also, the terms such as " . . . unit," "module," or the like used in the specification indicate an unit, which processes at least one function or motion, and the unit may be implemented by hardware or software, or by a combination of hardware and software.

The connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of all examples and example terms are merely for describing the disclosure in detail and the disclosure is not limited to the examples and the example terms, unless they are not defined in the scope of the claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a block diagram of a memory system 10 according to an embodiment. Referring to FIG. 1, the memory system 10, according to an embodiment, may include a memory controller 100 and a memory device 200. The memory controller 100 may perform a controlling operation with respect to the memory device 200. For example, the memory controller 100 may provide an address ADD and a command CMD to the memory device 200 so as to perform operations of programming (or writing), reading, and erasing on the memory device 200. Also, data for the program operation and read data may be transmitted and received between the memory controller 100 and the memory device 200. The memory device 200 may provide a pass/fail signal according to a read result of the read data to the memory controller 100, and the memory controller 100 may control a writing/reading operation of the memory cell array 210 based on the pass/fail signal.

The memory device 200 may include a memory cell array 210 and a voltage generator 220. The memory cell array 210 may include a plurality of memory cells arranged in regions where a plurality of word lines and a plurality of bit lines intersect. The memory cell array 210 may include nonvolatile memory cells storing data in a nonvolatile manner and include flash memory cells, as the nonvolatile memory cells, such as a NAND flash memory cell array or a NOR flash memory cell array. Hereinafter, embodiments of the disclosure will be described in detail on the assumption that the memory cell array 210 includes the flash memory cell array 210, and thus, the memory device 200 is a nonvolatile memory device.

The memory controller 100 may include a write/read controller 110, a voltage controller 120, and a data determiner 130.

The write/read controller 110 may generate an address ADD and a command CMD for performing programming/reading and erasing operations on the memory cell array 210. Also, the voltage controller 120 may generate a voltage control signal for controlling at least one voltage level used in the nonvolatile memory device 200. For example, the voltage controller 120 may generate a voltage control signal for controlling a voltage level of a word line for reading data from the memory cell array 210 or programming data on the memory cell array 210.

The data determiner 130 may determine the data read from the memory device 200. For example, in order to determine the data read from the memory cells, the data determiner 130 may determine the number of on cells and/or off cells from among the memory cells. As an example of an operation, when program operations are performed on the plurality of memory cells, a state of the data of the memory cells may be determined by using a desired and/or alternatively predetermined read voltage, in order to determine whether or not the program operations are normally completed on all of the cells.

As described above, the memory cell array 210 may include nonvolatile memory cells. For example, the memory cell array 210 may include flash memory cells. Also, the flash memory cells may be realized in various forms. For example, the memory cell array 210 may include three-dimensional (or vertical) NAND (or VNAND) memory cells.

Figure 2:
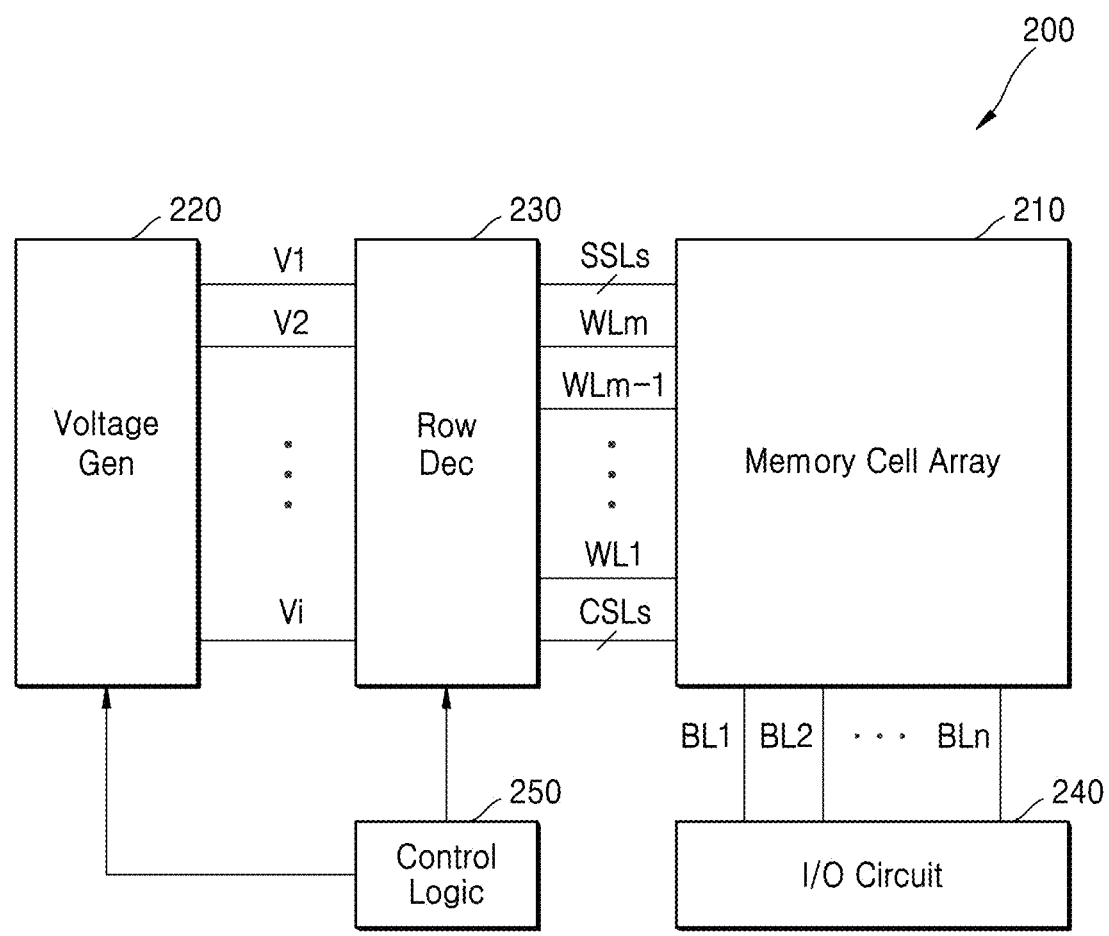
FIG. 2 is a block diagram of a memory device illustrated in FIG. 1, according to an embodiment.

FIG. 2 is a block diagram of the memory device 200 illustrated in FIG. 1, according to an embodiment. Referring to FIG. 2, the memory device 200 may further include a row decoder 230, an input and output circuit 240, and a control logic 250.

The memory cell array 210 may be connected to one or more string selection lines SSLs, a plurality of word lines WL1 through WLm, one or more common source line CSLs, and a plurality of bit lines BL1 through BLn. The voltage generator 220 may generate one or more word line voltages V1 through Vi, and the word line voltages V1 through Vi may be provided to the row decoder 230. Signals for programming/reading/erasing operations may be applied to the memory cell array 210 through the bit lines BL1 through BLn.

Also, data to be programmed may be provided to the memory cell array 210 through the input and output circuit 240, and read data may be provided to the outside (for example, a memory controller) through the input and output circuit 240. The control logic 250 may provide various control signals related to memory operations to the row decoder 230 and the voltage generator 220.

According to a decoding operation of the row decoder 230, the word line voltages V1 through Vi may be provided to various lines SSLs, WL1 through WLm, and CSLs. For example, the word line voltages V1 through Vi may include a string selection voltage, a word line voltage, and a ground selection voltage. The string selection voltage may be provided to one or more string selection lines SSLs, the word line voltage may be provided to one or more word lines WL1 through WLm, and the ground selection voltage may be provided to one or more common source lines CSLs.

Figure 3:
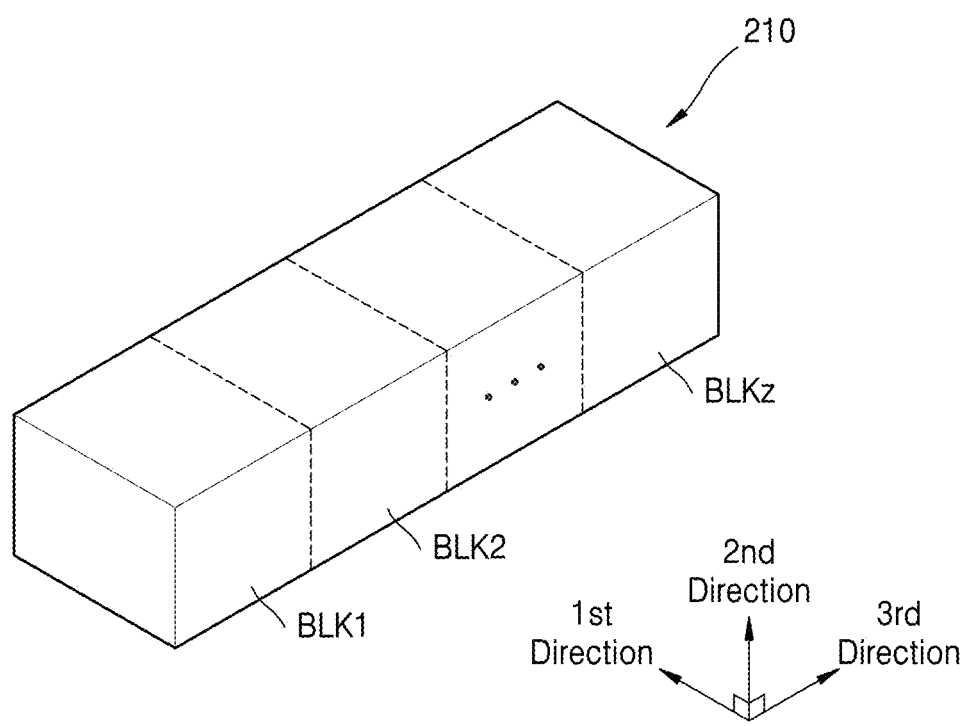
FIG. 3 is a block diagram of a memory cell array illustrated in FIG. 1, according to an embodiment.

FIG. 3 is a block diagram of the memory cell array 210 illustrated in FIG. 1. Referring to FIG. 3, the memory cell array 210 may include a plurality of memory blocks BLK1 through BLKz. Each of the memory blocks BLK1 through BLKz may have a three-dimensional structure (or a vertical structure). For example, each memory block BLK may include a structure extending in first through third directions. For example, each memory block BLK may include a plurality of memory cell strings extending in the second direction. Also, the plurality of memory cell strings may be two-dimensionally arranged in the first and third directions. Each memory cell string may be connected to the bit line BL, the string selection line SSL, the word lines WLs, and the common source line CSL. Thus, each of the memory blocks BLK1 through BLKz may be connected to the plurality of bit lines BLs, the plurality of string selection lines SSLs, the plurality of word lines WLs, and the plurality of common source lines CSLs. The memory blocks BLK1 through BLKz will be described in further detail with reference to FIG. 4.

Figure 4:
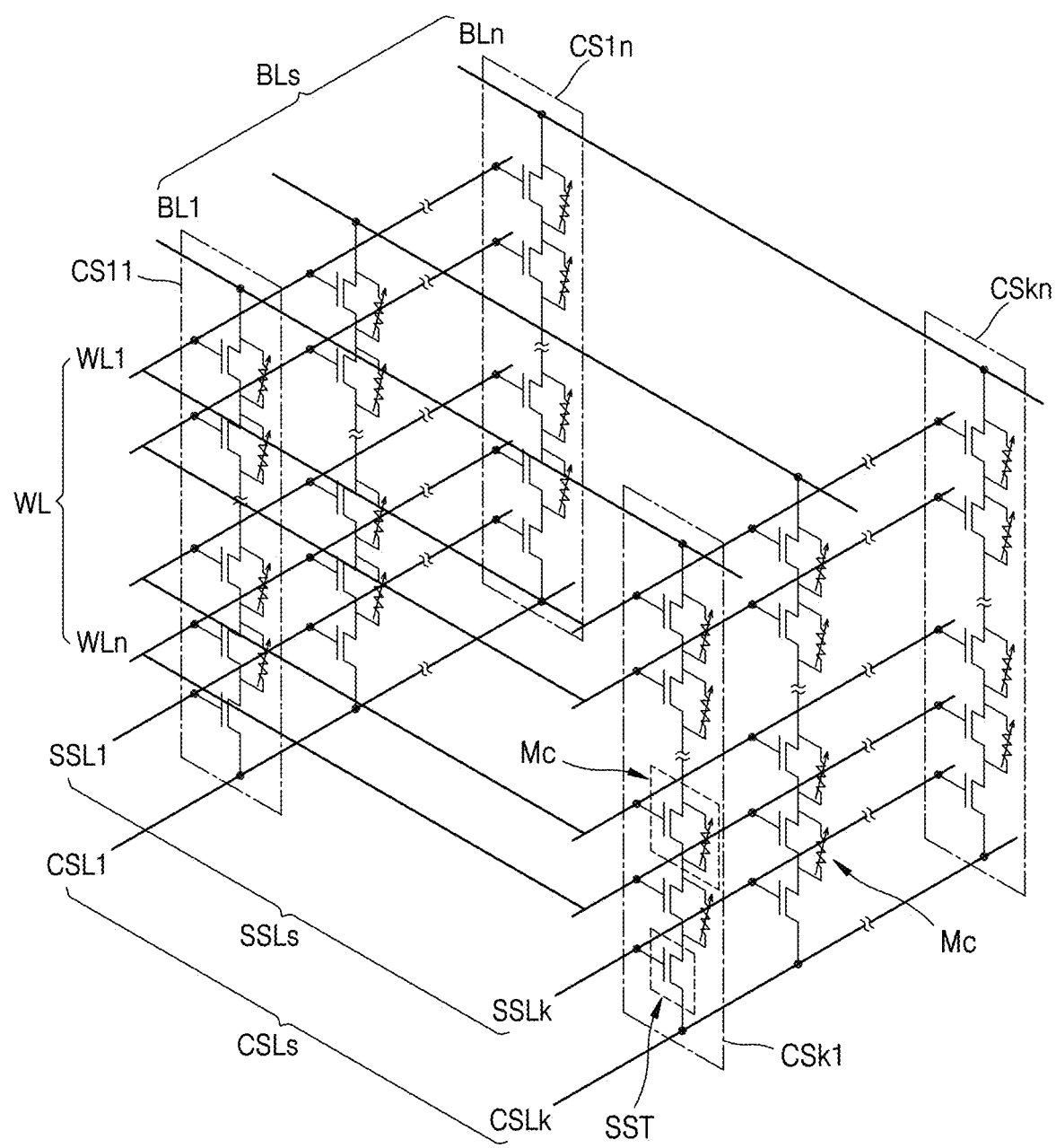
FIG. 4 is a circuit diagram of an equivalent circuit corresponding to a memory block, according to an embodiment.

FIG. 4 is a circuit diagram of an equivalent circuit corresponding to a memory block, according to an embodiment. For example, one of the memory blocks BLK1 through BLKz of the memory cell array 210 of FIG. 3 is illustrated in FIG. 4. Referring to FIGS. 3 and 4, each of the memory blocks BLK1 through BLKz may include a plurality of memory cell strings CS11 through CSkn. The plurality of memory cell strings CS11 through CSkn may be two-dimensionally arranged in a row direction and a column direction, thereby forming rows and columns. Each of the memory cell strings CS11 through CSkn may include a plurality of memory cells MCs and a plurality of string selection transistors SSTs. The memory cells MCs and the string selection transistors SSTs of each of the memory cell strings CS11 through CSkn may be stacked in a height direction.

Rows of the plurality of memory cell strings CS11 through CSkn may be connected to a plurality of string selection lines SSL1 through SSLk, respectively. For example, the string selection transistors SSTs of the memory cell strings CS11 through CS1n may be commonly connected to the string selection line SSL1. The string selection transistors SSTs of the memory cell strings CSk1 through CSkn may be commonly connected to the string selection line SSLk.

Also, columns of the plurality of memory cell strings CS11 through CSkn may be connected to the plurality of bit lines BL1 through BLn, respectively. For example, the memory cells MCs and the string selection transistors SSTs of the memory cell strings CS11 through CSk1 may be commonly connected to the bit line BL1, and the memory cells MCs and the string selection transistors SSTs of the memory cell strings CS1n through CSkn may be commonly connected to the bit line BLn.

Also, the rows of the plurality of memory cell strings CS11 through CSkn may be connected to the plurality of common source lines CSL1 through CSLk, respectively. For example, the string selection transistors SSTs of the plurality of memory cell strings CS11 through CS1n may be commonly connected to the common source line CSL1, and the string selection transistors SST of the plurality of memory cell strings CSk1 through CSkn may be commonly connected to the common source line CSLk.

The memory cells MC located at the same height from a substrate (or the string selection transistors SSTs) may be commonly connected to one word line WL, and the memory cells MC located at different heights from the substrate (or the string selection transistors SSTs) may be connected to the plurality of word lines WL1 through WLm, respectively.

The memory block illustrated in FIG. 4 is an example. The disclosure is not limited to the memory block illustrated in FIG. 4. For example, the number of rows of the plurality of memory cell strings CS11 through CSkn may be increased or decreased. When the number of rows of the plurality of memory cell strings CS11 through CSkn is changed, the number of string selection lines connected to the rows of the memory cell strings CS11 through CSkn and the number of memory cell strings CS11 through CSkn connected to one bit line may also be changed. When the number of rows of the memory cell strings CS11 through CSkn is changed, the number of common source lines connected to the rows of the memory cell strings CS11 through CSkn may also be changed. Also, the number of columns of the memory cell strings CS11 through CSkn may be increased or decreased. When the number of columns of the memory cell strings CS11 through CSkn is changed, the number of bit lines connected to the columns of the memory cell strings CS11 through CSkn and the number of memory cell strings CS11 through CSkn connected to one string selection line may also be changed.

A height of each of the memory cell strings CS11 through CSkn may be increased or decreased. For example, the number of memory cells MC stacked in each of the memory cell strings CS11 through CSkn may be increased or decreased. When the number of memory cells MC stacked in each of the memory cell strings CS11 through CSkn is changed, the number of word lines WL may also be changed. For example, the number of string selection transistors SSTs provided to each of the memory cell strings CS11 through CSkn may be increased. When the number of string selection transistors SSTs provided to each of the memory cell strings CS11 through CSkn is changed, the number of string selection lines or the number of common source lines may also be changed. When the number of string selection transistors SSTs is increased, the string selection transistors SSTs may be stacked in a shape that is the same as the shape in which the memory cells MC are stacked.

For example, writing and reading operations may be performed for each row of the memory cell strings CS11 through CSkn. The memory cell strings CS11 through CSkn may be selected for each row by the common source lines CSLs, and the memory cell strings CS11 through CSkn may be selected for each row by the string selection lines SSLs. Also, the writing and reading operations may be performed for each page, in a selected row of the memory cell strings CS11 through CSkn. For example, the page may be one row of the memory cells MC connected to one word line WL. In the selected row of the memory cell strings CS11 through CSkn, the memory cells MCs may be selected for each page by the word lines WL.

Figure 5:
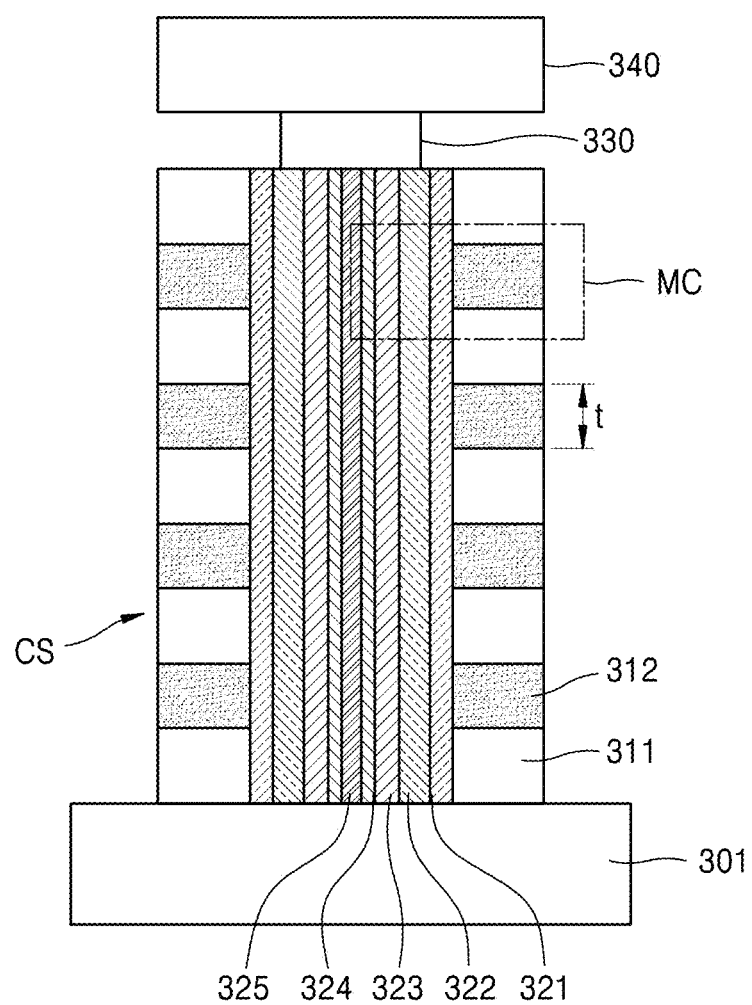
FIG. 5 is a schematic cross-sectional view of a structure of a respective memory cell string, according to an embodiment.

Each of the memory cells MCs in each of the memory cell strings CS11 through CSkn may correspond to a circuit in which a transistor and a resistor are connected in parallel. For example, FIG. 5 is a schematic cross-sectional view of a structure of a respective memory cell string CS, according to an embodiment. Referring to FIG. 5, the memory cell string CS may include a substrate 301. The substrate 301 may include, for example, a doped silicon material. Also, although not illustrated in detail, the substrate 301 may include a plurality of string selection transistors SSTs, peripheral circuits, etc.

Above the substrate 301, a plurality of insulating spacers 311 extending in a horizontal direction, that is, a direction parallel with a surface of the substrate 301, and a plurality of gate electrodes 312 extending in the horizontal direction may be alternately arranged. In other words, the memory cell string CS may include the plurality of insulating spacers 311 and the plurality of gate electrodes 312 alternately stacked in a vertical direction that is orthogonal to the horizontal direction. For example, the gate electrodes 312 may include at least one of a metal material and a conductive two-dimensional material, and the insulating spacers 311 may include a silicon oxide. However, the gate electrodes 312 and the insulating spacers 311 are not limited thereto. Each of the gate electrodes 312 may be connected to a word line WL, or each of the gate electrodes 312 may be directly a word line WL.

Also, the memory cell string CS may include a channel hole vertically penetrating the plurality of insulating spacers 311 and the plurality of gate electrodes 312. A plurality of layers to form a resistor and a channel may be arranged on an inner side of the channel hole. For example, the memory cell string CS may include a barrier dielectric layer 321, a charge trap layer 322, a tunneling dielectric layer 323, a channel semiconductor layer 324, and an insulating support 325 arranged on the inner side of the channel hole.

The barrier dielectric layer 321 may be conformally deposited on the plurality of insulating spacers 311 and the plurality of gate electrodes 312 and may extend in the vertical direction. The charge trap layer 322 may be conformally deposited on a surface of the barrier dielectric layer 321 and may extend in the vertical direction. The tunneling dielectric layer 323 may be conformally deposited on a surface of the charge trap layer 322 and may extend in the vertical direction. The channel semiconductor layer 324 may be conformally deposited on a surface of the tunneling dielectric layer 323 and may extend in the vertical direction. The insulating support 325 may be arranged to fill a remaining space of a center of the channel hole and may extend in the vertical direction. The barrier dielectric layer 321, the charge trap layer 322, and the tunneling dielectric layer 323 may together form a gate insulating layer.

A drain 330 may be arranged above the memory cell string CS to cover at least the charge trap layer 322, the tunneling dielectric layer 323, and the channel semiconductor layer 324. The drain 330 may include a doped silicon material. The substrate 301 and the drain 330 may be doped to be electrically opposite to each other. For example, when the substrate 301 is doped with a p-type, the drain 330 may be doped with an n-type. Also, a bit line 340 may be arranged above the drain 330.

As indicated by a dotted box in FIG. 5, any one gate electrode 312, and a portion of the dielectric layer 321, a portion of the charge trap layer 322, a portion of the tunneling dielectric layer 323, and a portion of the channel semiconductor layer 324, which are adjacent to the gate electrode 312 in the horizontal direction, may be configuration elements of one memory cell MC. The memory cell MC having this structure may be vertically stacked in a multiple number to form the respective memory cell string CS. FIG. 5 illustrates that the memory cell MC is configured based on a charge trap flash (CTF) memory using a phase change material. However, the memory cell MC is not necessarily limited thereto. Thus, the structure of the layers arranged on the inner side of the channel hole is only an example and is not limited to the structure illustrated in FIG. 5.

According to the present embodiment, a thickness t of each gate electrode 312 may for example have a range of about 0.3 nm to about 15 nm. When the gate electrode 312 is formed to have such a small thickness, the gate electrode 312 may be damaged, when an upper surface of the gate electrode 312 is exposed in order to form a contact. To limit and/or prevent this damage to the gate electrode 312, the contact may be formed without exposing the upper surface of the gate electrode 312.

Figure 6:
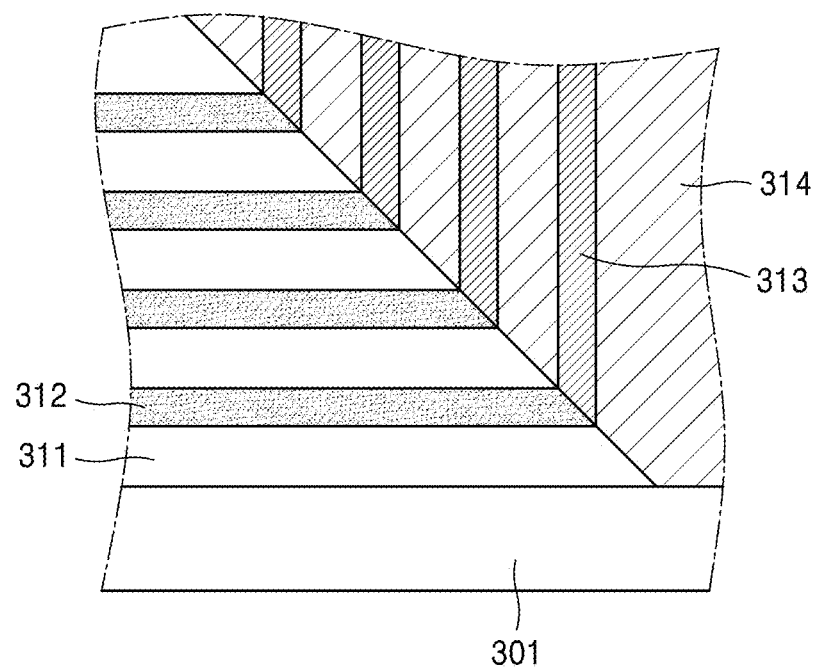
FIG. 6 is a schematic cross-sectional view of a structure for electrical connection between a plurality of gate electrodes and a plurality of contacts, according to an embodiment.

For example, FIG. 6 is a schematic cross-sectional view of a structure for electrical connection between a plurality of gate electrodes and a plurality of contacts, according to an embodiment. FIG. 6 partially illustrates only a region of the memory cell string CS illustrated in FIG. 5, where the insulating spacers 311 and the gate electrodes 312 are arranged. Referring to FIG. 6, the insulating spacers 311 and the gate electrodes 312 may be etched to have an inclined peripheral side surface. For convenience, FIG. 5 illustrates that a peripheral side surface of the insulating spacers 311 and the gate electrodes 312 vertically extends with respect to the substrate 301. However, actually, the insulating spacers 311 and the gate electrodes 312 may have the inclined peripheral side surface as illustrated in FIG. 6.

For example, a bottommost insulating spacer 311 arranged directly above the substrate 301 may have the greatest width in the horizontal direction, and widths of the gate electrodes 312 and the insulating spacers 311 alternately arranged above the bottommost insulating spacer 311 may upwardly gradually decrease. The peripheral side surface of the insulating spacers 311 and the gate electrodes 312 may have a continually extending sloped surface. In other words, a horizontal width of an upper surface of any one gate electrode 312 may be the same as a horizontal width of a lower surface of the insulating spacer 311 directly arranged on the gate electrode 312, and a horizontal width of a lower surface of the gate electrode 312 may be the same as a horizontal width of an upper surface of the insulating spacer 311 directly arranged below the gate electrode 312. In this case, the upper surface of the gate electrodes 312 may not be exposed, and only the inclined peripheral side surface may be exposed to the outside. A plurality of contacts 313 may be respectively arranged to contact the inclined peripheral side surface of the gate electrodes 312 that are respectively corresponding to the plurality of contacts 313 and not to contact the upper surface of the gate electrodes 312. For example, the plurality of contacts 313 may respectively extend from the inclined peripheral side surface of the gate electrodes 312 respectively corresponding to the plurality of contacts 313, in a direction perpendicular to a surface of the substrate 301. A passivation layer 314 may be filled around the plurality of contacts 313.

In order to form a structure illustrated in FIG. 6, first, the insulating spacers 311 and the gate electrodes 312 may be etched to have a sloped shape. Thereafter, the passivation layer 314 may be formed above the sloped surface of the insulating spacers 311 and the gate electrodes 312, and a plurality of contact holes may be formed in the passivation layer 314 to expose the inclined peripheral side surface of the gate electrodes 312. Then, a conductive material may be filled in the plurality of contact holes to form the plurality of contacts 313.

According to the structure illustrated in FIG. 6, the upper surface of the gate electrodes 312 is not exposed, and only the cross-sectional side surface of the gate electrodes 312 are exposed in a sloped manner, and thus, during a process of etching the insulating spacers 311 and the gate electrodes 312, damage to the upper surface of the gate electrodes 312 may be limited and/or prevented. Thus, even when the thicknesses t of the gate electrodes 312 decrease, the contacts 313 may be reliably formed without damaging the gate electrodes 312. Also, according to an embodiment, by reducing the thicknesses t of the gate electrodes 312 vertically stacked in the memory cell string CS, a thickness of one memory cell MC may be reduced. Thus, an entire thickness of the memory cell string CS may be reduced, and the number of memory cells MC stacked in one memory cell string CS may be increased.

Figure 7:
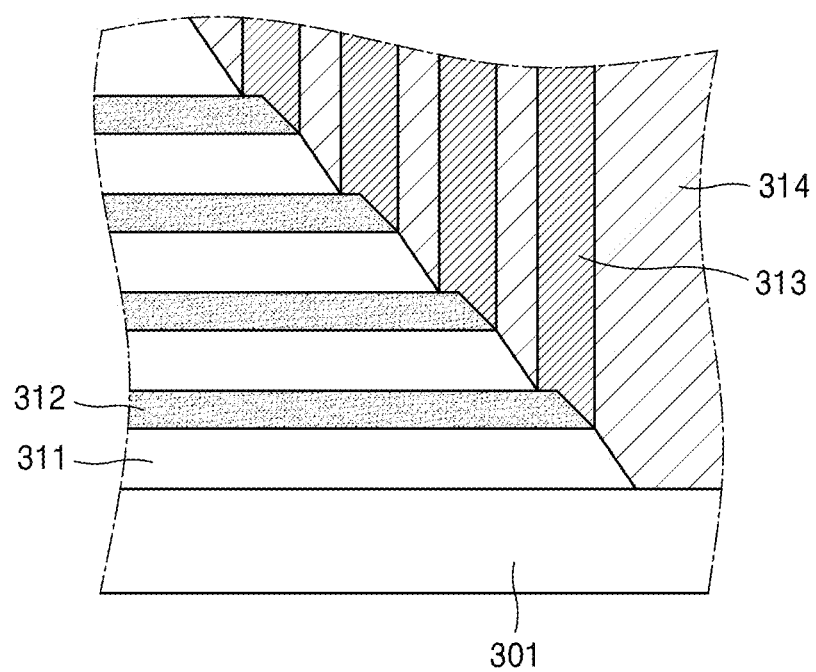
FIG. 7 is a schematic cross-sectional view of a structure for electrical connection between a plurality of gate electrodes and a plurality of contacts, according to another embodiment.

FIG. 7 is a schematic cross-sectional view of a structure for electrical connection between a plurality of gate electrodes and a plurality of contacts, according to another embodiment. In a process of etching of the insulating spacers 311 and the gate electrodes 312, a selectivity may be slightly differently selected between the insulating spacers 311 and the gate electrodes 312 such that the insulating spacers 311 may be slightly more rapidly etched than the gate electrodes 312. Then, as illustrated in FIG. 7, when etching is completed, a gradient of an inclined peripheral side surface of the insulating spacers 311 may be slightly greater than a gradient of an inclined peripheral side surface of the gate electrodes 312. Then, a horizontal width of a lower surface of the insulating spacer 311 arranged directly above the gate electrode 312 may be slightly smaller than a horizontal width of an upper surface of the gate electrode 312 below the insulating spacer 311. Accordingly, an edge portion of the upper surface of the gate electrode 312 may be slightly exposed with respect to the insulating spacer 311. In this case, the contacts 313 may be respectively arranged to cover both the exposed edge portion of the upper surface of the gate electrodes 312 and the inclined peripheral side surface of the gate electrodes 312 respectively corresponding to the contacts 313.

When a thickness of the gate electrode 312 decreases, a mean free path, which is a distance travelled by electrons in a metal without collision with atoms, decreases, and thus, resistance and specific resistance of the gate electrode 312 may increase. To suppress or alleviate the resistance increase due to the thickness decrease of the gate electrode 312, a conductive two-dimensional material or a conductive two-dimensional material together with a metal may be used as a material of the gate electrode 312.

Figure 8:
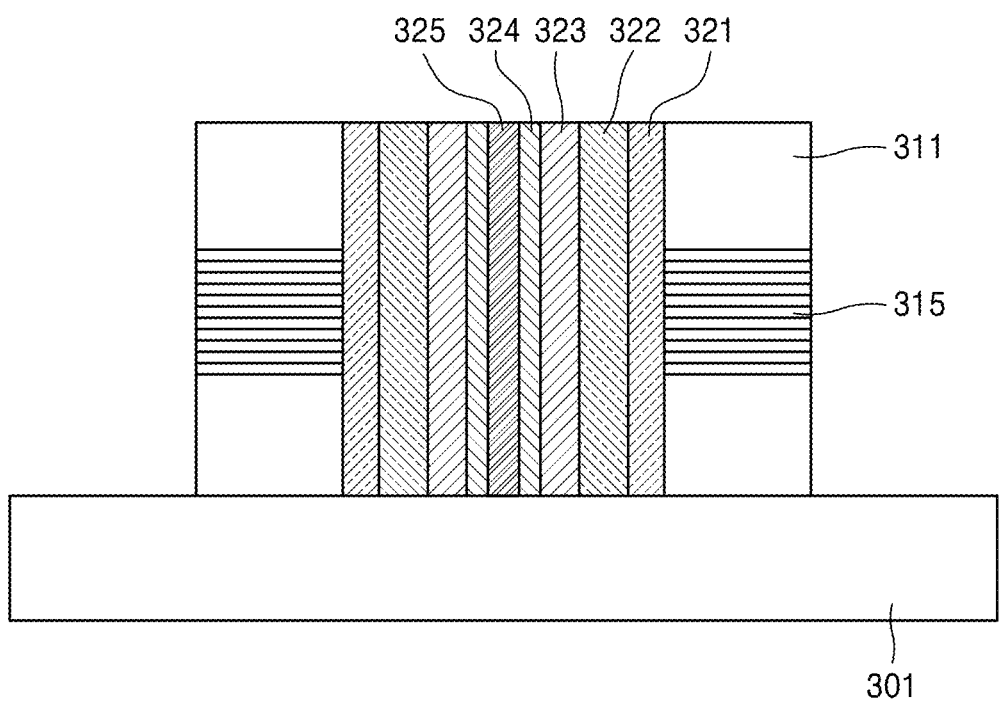
FIG. 8 is a schematic cross-sectional view of a structure of a memory cell, according to an embodiment.

For example, FIG. 8 is a schematic cross-sectional view of a structure of a memory cell, according to an embodiment. FIG. 8 illustrates only one memory cell, for convenience, and the memory cell illustrated in FIG. 8 may be repeatedly stacked to form a memory cell string. Referring to FIG. 8, the memory cell may include insulating spacers 311 and a gate electrode 315 arranged between the insulating spacers 311. The gate electrode 315 may include a conductive two-dimensional material. For example, the conductive two-dimensional material forming the gate electrode 315 may include at least one of a graphene, AuSe, $MoTe_2$, $NbSe_2$, $NbS_2$, $NbTe_2$, $PdTe_2$, $PtTe_2$, $TaS_2$, $TaSe_2$, and $VSe_2$.

The conductive two-dimensional material may be configured to have a layer structure having a two-dimensional crystalline structure. Unlike a previously known metal material, the conductive two-dimensional material may have extremely low charge dispersion at a thickness of about 0.34 nm or about 1 nm, and thus, may have a lower resistance than the previous metal at a thickness of several nms. Thus, by using the conductive two-dimensional material as a material of the gate electrode 315, a resistance increase due to a thickness decrease of the gate electrode 315 may be suppressed or alleviated. To further reduce the charge dispersion in the gate electrode 315, the conductive two-dimensional material may have a grain having a relatively large size. For example, a grain size of the conductive two-dimensional material forming the gate electrode 315 may be between about 1 nm and about 10 cm.

The conductive two-dimensional material may be formed by chemical vapor deposition (CVD) or atomic layer deposition (ALD). When manufacturing the memory cell, the memory cell may be manufactured by repeatedly depositing the insulating spacer 311 and the gate electrode 315. Or, the memory cell may be manufactured by using a method in which, after the insulating spacer 311 and a sacrificial layer are repeatedly deposited, the sacrificial layer may be removed via etching, and a conductive two-dimensional material may be deposited to form the gate electrode 315 in a space between the insulating spacers 311. Because the conductive two-dimensional material has a layer structure, the gate electrode 315 may be formed by stacking the conductive two-dimensional material having at least one layer. Thus, a thickness of the gate electrode 315 may further be reduced by using the conductive two-dimensional material.

Figure 9:
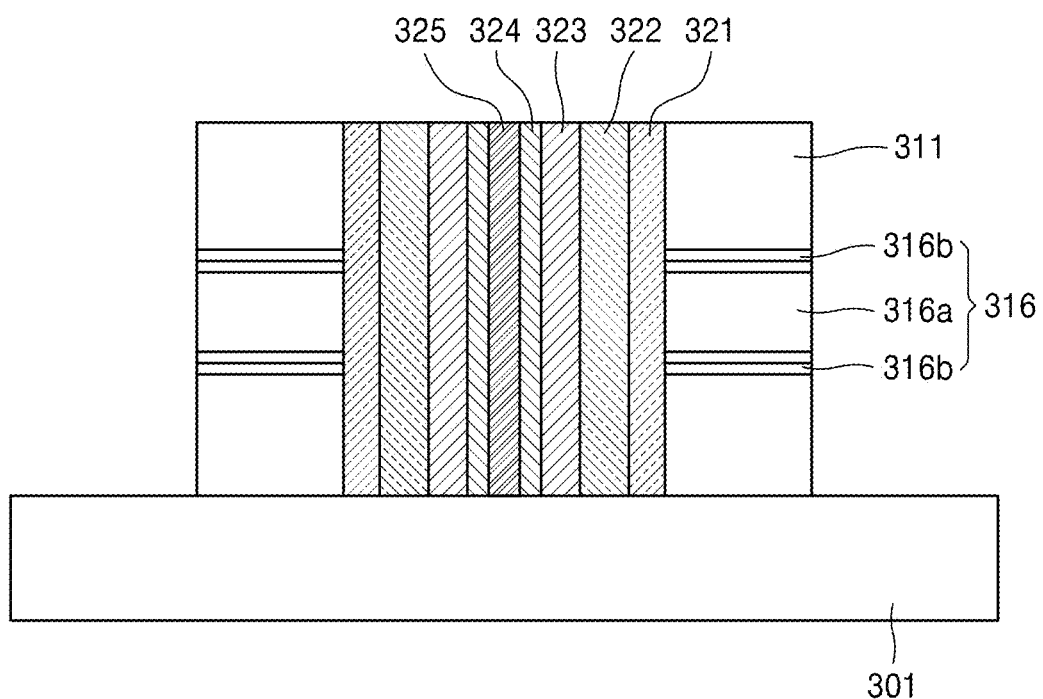
FIG. 9 is a schematic cross-sectional view of a structure of a memory cell, according to another embodiment.

FIG. 9 is a schematic cross-sectional view of a structure of a memory cell, according to another embodiment. In FIG. 8, the gate electrode 315 is formed by using only the conductive two-dimensional material. However, a general metal material may also be used together with the conductive two-dimensional material. Referring to FIG. 9, a gate electrode 316 of the memory cell may include a metal material layer 316a and a conductive two-dimensional material layer 316b arranged on a lower surface and/or an upper surface of the metal material layer 316a. FIG. 9 illustrates that the conductive two-dimensional material layer 316b is arranged on each of the lower surface and the upper surface of the metal material layer 316a. However, the conductive two-dimensional material layer 316b may be arranged only on the lower surface or on the upper surface of the metal material layer 316a. The memory cell illustrated in FIG. 9 may be manufactured by using a method in which, after the insulating spacer 311, the conductive two-dimensional material layer 316b, a sacrificial layer, and the conductive two-dimensional material layer 316b are sequentially stacked, the sacrificial layer may be removed, and the metal material layer 316a may be deposited between the conductive two-dimensional material layers 316b.

Figure 10:
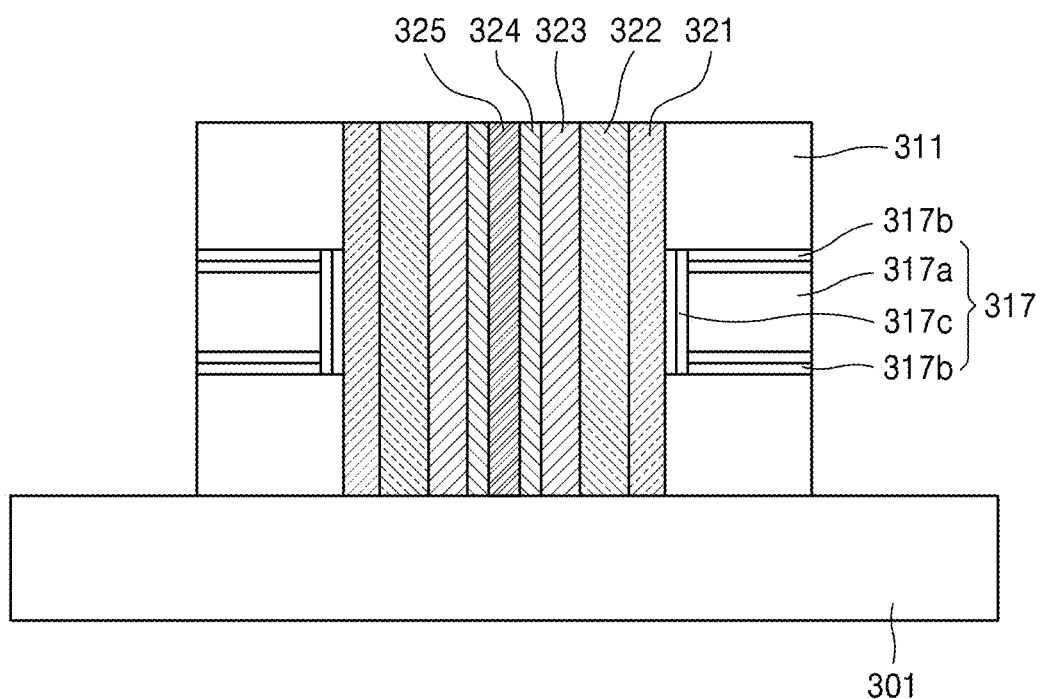
FIG. 10 is a schematic cross-sectional view of a structure of a memory cell, according to another embodiment.

FIG. 10 is a schematic cross-sectional view of a structure of a memory cell, according to another embodiment. Referring to FIG. 10, a gate electrode 317 of the memory cell may include a metal material layer 317a, a first conductive two-dimensional material layer 317b arranged on a lower surface and/or an upper surface of the metal material layer 317a, and a second conductive two-dimensional material layer 317c arranged on a side surface of the metal material layer 317a. The second conductive two-dimensional material layer 317c arranged on the side surface of the metal material layer 317a may be arranged between the side surface of the metal material layer 317a and a gate insulating layer, in particular, between the side surface of the metal material layer 317a and a barrier dielectric layer 321, when the memory cell is based on a charge trap flash memory.

A layer direction of the first conductive two-dimensional material layer 317b arranged on each of the lower surface and the upper surface of the metal material layer 317a, and a layer direction of the second conductive two-dimensional material layer 317c arranged on the side surface of the metal material layer 317a may be vertical with respect to each other. For example, the layer direction of the first conductive two-dimensional material layer 317b arranged on each of the lower surface and the upper surface of the metal material layer 317a may extend in a horizontal direction, that is, a direction parallel with the lower surface or the upper surface of the metal material layer 317a. In contrast, the second conductive two-dimensional material layer 317c arranged on the side surface of the metal material layer 317a may extend in a vertical direction, that is, a direction parallel with the side surface of the metal material layer 317a. Although not illustrated, the memory cell in FIG. 10 may be modified by omitting the conductive first two-dimensional material layer 317b on the lower and/or upper surface of the metal material layer 317a, but retaining the second conductive two-dimensional material layer 317c on the side surface of the metal material layer 317a.

Figure 11:
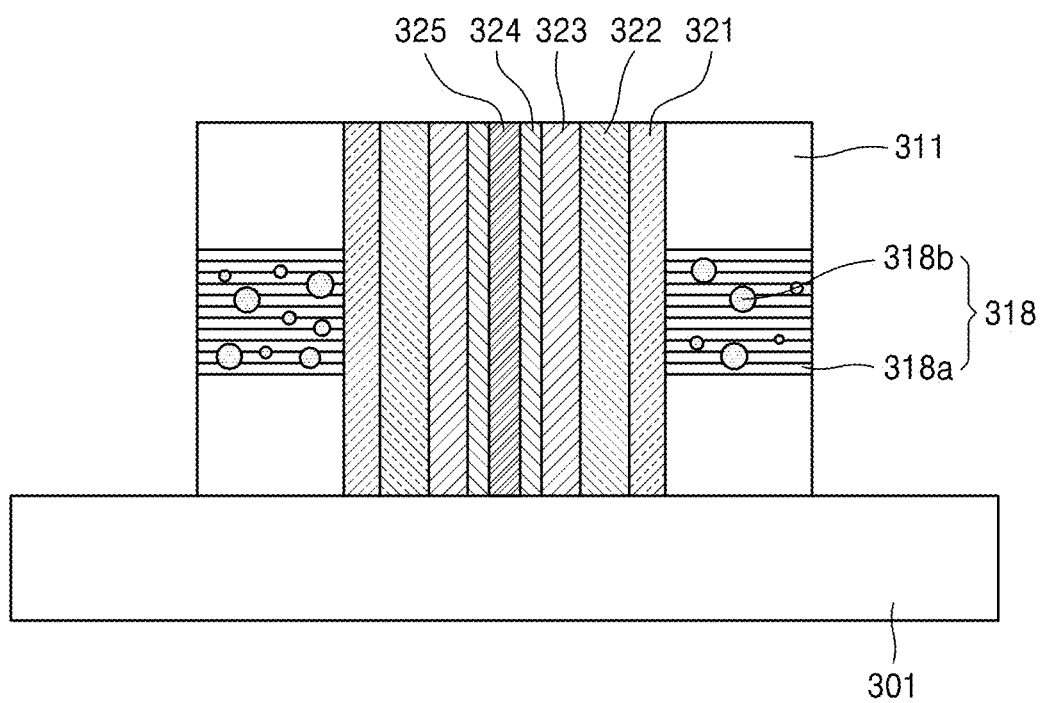
FIG. 11 is a schematic cross-sectional view of a structure of a memory cell, according to another embodiment.

FIG. 11 is a schematic cross-sectional view of a structure of a memory cell, according to another embodiment. Referring to FIG. 11, a gate electrode 318 of the memory cell may include a conductive two-dimensional material layer 318a arranged between two insulating spacers 311 and a metal material 318b doped in the conductive two-dimensional material layer 318a. For example, in a process of depositing the conductive two-dimensional material layer 318a above the insulating spacer 311, the metal material 318b may also be deposited together with the conductive two-dimensional material layer 318a, and thus, the metal material 318b may be doped in the conductive two-dimensional material layer 318a. In this case, metal elements may be distributed between crystals of the conductive two-dimensional material layer 318a. A doping concentration of the metal material 318b in the conductive two-dimensional material layer 318a may be, for example, about $10^{18}/cm^3$ to about $10^{22}/cm^3$. The doped metal material 318b may include, for example, at least one of Ag, Au, Pt, Ru, Mo, W, Al, Cu, Co, and Cr having good conductivity. By doping the metal material 318b in the conductive two-dimensional material layer 318a, a resistance of the gate electrode 318 may further decrease. Although not illustrated, the conductive two-dimensional material layers 316b, 317b, and 317c illustrated in FIGS. 9 and 10 may also be doped with a metal material.

Figure 12:
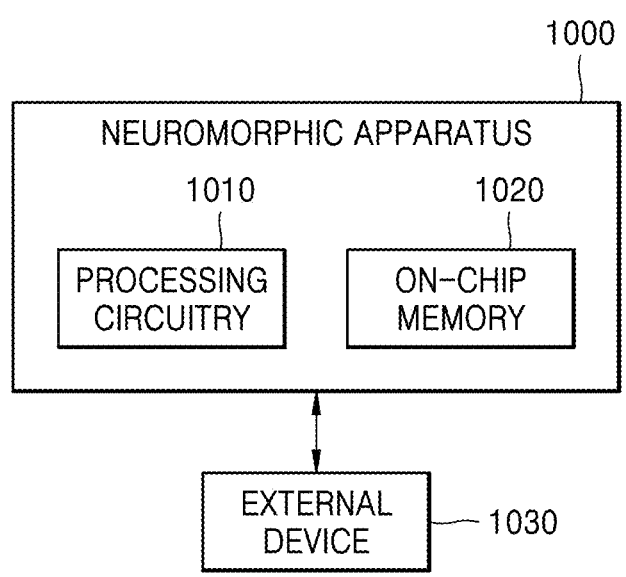
FIG. 12 is a schematic block diagram of a neuromorphic apparatus including a memory device, according to an embodiment.

A memory block according to the embodiment described above may be realized in the form of a chip and may be used as a neuromorphic computing platform. For example, FIG. 12 is a schematic view of a neuromorphic apparatus 1000 including a memory device, according to an embodiment. Referring to FIG. 12, the neuromorphic apparatus 1000 may include processing circuitry 1010 and/or a memory 1020. The memory 1020 of the neuromorphic apparatus 1000 may include the memory system 10 according to an embodiment.

Processing circuitry 1010 may be configured to control functions for driving the neuromorphic apparatus 1000. For example, the processing circuitry 1010 may be configured to control the neuromorphic apparatus 1000 by executing programs stored in the memory 1020 of the neuromorphic apparatus 1000. The processing circuitry 1010 may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1700, an arithmetic logic unit (ALU), a digital signal processor, a microcomputer, a field programmable gate array (FPGA), a system-on-chip (SoC), a programmable logic unit, a microprocessor, application-specific integrated circuit (ASIC), or the like. Also, the processing circuitry 1010 may be configured to read/write various data from/in the external device 1030 and/or execute the neuromorphic apparatus 1000 by using the read/written data. The external device 1030 may include an external memory and/or sensor array with an image sensor (e.g., CMOS image sensor circuit).

Likewise, one or more elements disclosed above in FIGS. 1-2, such as for example the memory controller 100 and/or control logic 250, but not limited thereto, may be implemented in processing circuitry such as hardware including logic circuits; a hardware/software combination such as a processor executing software; or a combination thereof.

The neuromorphic apparatus 1000 in FIG. 12 may be applied in a machine learning system. The machine learning system may utilize a variety of artificial neural network organizational and processing models, such as convolutional neural networks (CNN), de-convolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

It should be understood that embodiments described herein should be considered in a descriptive sense only and not for purposes of limitation. Descriptions of features or aspects within each embodiment should typically be considered as available for other similar features or aspects in other embodiments. For example, while FIGS. 6 and 7 illustrate electrical connections between the plurality of gate electrodes 312 and the plurality of contacts 313, the gate electrodes in other embodiments may be substituted for the gate electrodes 312 shown in FIGS. 6 and 7. For example, the gate electrodes 316, 317, and 318 described above in FIGS. 8 to 11 may be used in place of the gate electrodes 312 shown in FIGS. 6 and 7.

While one or more embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
a plurality of memory cell strings, each of the plurality of memory cell strings including
a plurality of insulating spacers each extending in a first direction,
a plurality of gate electrodes each extending in the first direction and alternately arranged with the plurality of insulating spacers in a second direction perpendicular to the first direction, and
a plurality of contacts respectively arranged to contact a side surface of the plurality of gate electrodes respectively corresponding to the plurality of contacts,
wherein a wide the first direction of the plurality of insulating spacers and the plurality of gate electrodes, which are alternatively arranged with each other, gradually decreases in the second direction, and the plurality of insulating spacers and the plurality of gate electrodes each have an inclined peripheral side surface.

2. The nonvolatile memory device of claim 1, wherein a thickness of each of the plurality of gate electrodes is in a range of about 0.3 nm to about 15 nm.

3. The nonvolatile memory device of claim 1, wherein the inclined peripheral side surface of the plurality of insulating spacers and the plurality of gate electrodes alternately arranged with each other has a continually extending sloped surface.

4. The nonvolatile memory device of claim 3, wherein, for each corresponding gate electrode among the plurality of gate electrodes,
the width in the first direction of an upper surface of the corresponding gate electrode is identical to a width in the first direction of a lower surface of an overlying one of the plurality of insulating spacers above the corresponding gate electrode, and
the width in the first direction of a lower surface of the corresponding gate electrode is identical to the width in the first direction of an upper surface of an underlying one of the plurality of insulating spacers below the corresponding gate electrode.

5. The nonvolatile memory device of claim 3, wherein the plurality of contacts are respectively arranged to contact the inclined peripheral side surface of the plurality of gate electrodes respectively corresponding to the plurality of contacts and not to contact an upper surface of the plurality of gate electrodes respectively corresponding to the plurality of contacts.

6. The nonvolatile memory device of claim 1, wherein a gradient of the inclined peripheral side surface of each of the plurality of insulating spacers is greater than a gradient of the inclined peripheral side surface of each of the plurality of gate electrodes, and
wherein an edge portion of upper surfaces of the plurality of gate electrodes is exposed to provide an exposed edge portion.

7. The nonvolatile memory device of claim 6, wherein the plurality of insulating spacers have smaller widths in the first direction than widths of upper surfaces of the plurality of gate electrodes arranged directly below, respectively.

8. The nonvolatile memory device of claim 6, wherein the plurality of contacts are respectively arranged to cover both the exposed edge portion of the upper surface and the inclined peripheral side surface of the plurality of gate electrodes respectively corresponding to the plurality of contacts.

9. The nonvolatile memory device of claim 1, wherein the plurality of contacts extend in the second direction.

10. The nonvolatile memory device of claim 1, wherein each of the memory cell strings further comprises a passivation layer arranged to fill a region around the plurality of contacts.

11. The nonvolatile memory device of claim 1, wherein each of the plurality of gate electrodes comprises a conductive two-dimensional material layer.

12. The nonvolatile memory device of claim 11, wherein the conductive two-dimensional material layer comprises at least one of a graphene, AuSe, $MoTe_2$, $NbSe_2$, $NbS_2$, $NbTe_2$, $PdTe_2$, $PtTe_2$, $TaS_2$, $TaSe_2$, and $VSe_2$.

13. The nonvolatile memory device of claim 11, wherein a grain size of the conductive two-dimensional material layer is in a range of about 1 nm to about 10 cm.

14. The nonvolatile memory device of claim 11, wherein each of the plurality of gate electrodes further comprises a metal material doped in the conductive two-dimensional material layer.

15. The nonvolatile memory device of claim 14, wherein a doping concentration of the metal material in the conductive two-dimensional material layer is in a range of about $10^{18}/cm^3$ to about $10^{22}/cm^3$.

16. The nonvolatile memory device of claim 14, wherein the metal material comprises at least one of Ag, Au, Pt, Ru, Mo, W, Al, Cu, Co, and Cr.

17. A nonvolatile memory device comprising:
a plurality of memory cell strings, each of the plurality of memory cell strings including
a plurality of insulating spacers each extending in a first direction,
a plurality of gate electrodes each extending in the first direction and alternately arranged with the plurality of insulating spacers in a second direction perpendicular to the first direction, and
a plurality of contacts respectively arranged to contact a side surface of the plurality of gate electrodes respectively corresponding to the plurality of contacts,
wherein each of the plurality of gate electrodes comprises a metal material layer and a first conductive two-dimensional material layer, and
the first conductive two-dimensional material layer is on a lower surface of the metal material layer or an upper surface of the metal material layer.

18. The nonvolatile memory device of claim 17, wherein each of the plurality of gate electrodes further comprises a second conductive two-dimensional material layer on a side surface of the metal material layer.

19. The nonvolatile memory device of claim 18, wherein a layer direction of the first conductive two-dimensional material layer and a layer direction of the second conductive two-dimensional material layer are perpendicular to each other.

20. A nonvolatile memory device comprising:
a plurality of memory cell strings,
each of the plurality of memory cell strings including a plurality of insulating spacers, a plurality of gate electrodes, and a plurality of contacts,
the plurality of insulating spacers and the plurality of gate electrodes extending in a first direction and being alternately stacked in a second direction crossing the first direction,
the plurality of gate electrodes including inclined peripheral side surfaces that are inclined in a direction diagonal between the first direction and the second direction,
the plurality of contacts including inclined lower surfaces that are inclined in the direction diagonal between the first direction and the second direction, and
the plurality of contacts being electrically connected to the plurality of gate electrodes, respectively, through the connections between the inclined lower surfaces of the plurality of contacts and the inclined peripheral side surfaces of the plurality of gate electrodes.

21. The nonvolatile memory device of claim 20, further comprising:
- a passivation layer including portions extending between the plurality of contacts in the second direction to separate the plurality of contacts from each other, wherein
- a lower surface of the passivation layer contacts side surfaces of the plurality of insulating layers.

22. The nonvolatile memory device of claim 20, wherein
- the plurality of insulating spacers include peripheral side surfaces that are recessed in the second direction from the inclined peripheral side surfaces of the plurality of gate electrodes adjacent thereto,
- the plurality of contacts include horizontal lower surfaces that extend in the second direction from the inclined lower surfaces of the plurality of contacts, and
- the horizontal lower surfaces of corresponding contacts among the plurality of contacts extend in the second direction toward corresponding insulating spacers among the plurality of insulating spacers and contact parts of upper surfaces of corresponding gate electrodes among the plurality of gate electrodes.

23. The nonvolatile memory device of claim 20, wherein each of the plurality of gate electrodes comprises a conductive two-dimensional material layer.

24. The nonvolatile memory device of claim 20, wherein each of the plurality of gate electrodes is doped with a metal material.

* * * * *